United States Patent
Sun et al.

(10) Patent No.: US 11,643,325 B2
(45) Date of Patent: *May 9, 2023

(54) MICRO-ELECTROMECHANICAL SYSTEM PACKAGE HAVING MOVABLE PLATFORM

(71) Applicant: PixArt Imaging Inc., Hsin-Chu County (TW)

(72) Inventors: Chih-Ming Sun, Hsin-Chu County (TW); Ming-Han Tsai, Hsin-Chu County (TW); Yu-Tao Lee, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/939,205

(22) Filed: Sep. 7, 2022

(65) Prior Publication Data
US 2023/0002214 A1    Jan. 5, 2023

Related U.S. Application Data

(60) Continuation of application No. 17/091,062, filed on Nov. 6, 2020, now Pat. No. 11,465,901, which is a continuation of application No. 16/783,627, filed on Feb. 6, 2020, now Pat. No. 10,858,238, which is a continuation of application No. 16/448,612, filed on Jun. 21, 2019, now Pat. No. 10,589,982, which is a division of application No. 15/891,975, filed on Feb. 8, 2018, now Pat. No. 10,384,928.

(51) Int. Cl.
| | |
|---|---|
| B81B 3/00 | (2006.01) |
| H01L 27/146 | (2006.01) |
| H01L 23/00 | (2006.01) |
| B81C 1/00 | (2006.01) |

(52) U.S. Cl.
CPC ........ B81B 3/0021 (2013.01); B81C 1/00142 (2013.01); H01L 24/16 (2013.01); H01L 27/14618 (2013.01); H01L 27/14636 (2013.01); B81B 2201/033 (2013.01); B81B 2203/0109 (2013.01); B81B 2203/0172 (2013.01); B81B 2203/04 (2013.01); B81B 2203/051 (2013.01); B81B 2203/055 (2013.01); B81B 2207/07 (2013.01); H01L 2224/16245 (2013.01); H01L 2924/1461 (2013.01)

(58) Field of Classification Search
None
See application file for complete search history.

(56) References Cited

U.S. PATENT DOCUMENTS 10,858,238 B2 * 12/2020 Sun .................... B81C 1/00142
11,465,901 B2 * 10/2022 Sun .................... B81C 1/00142

* cited by examiner

Primary Examiner — J. E. Schoenholtz
(74) Attorney, Agent, or Firm — WPAT, P.C

(57) ABSTRACT

A MEMS package including a fixed frame, a moveable platform and elastic restoring members is provided. The moveable platform is moved with respect to the fixed frame. The elastic restoring members are connected between the fixed frame and the moveable platform, and used to restore the moved moveable platform to an original position.

20 Claims, 9 Drawing Sheets

US 11,643,325 B2

MICRO-ELECTROMECHANICAL SYSTEM PACKAGE HAVING MOVABLE PLATFORM

CROSS REFERENCE TO RELATED APPLICATION

This application is a continuation application of U.S. application Ser. No. 17/091,062, filed on Nov. 6, 2020, which is a continuation application of U.S. application Ser. No. 16/783,627, filed on Feb. 6, 2020, which is a continuation application of U.S. application Ser. No. 16/448,612, filed on Jun. 21, 2019, which is a divisional application of U.S. application Ser. No. 15/891,975, filed on Feb. 8, 2018, the full disclosures of which are incorporated herein by reference.

BACKGROUND

1. Field of the Disclosure

This disclosure generally relates to a sensor package, more particularly, to an encapsulation with a movable sensor that arranges a sensor on a movable platform of a MEMS actuator and a manufacturing method thereof.

2. Description of the Related Art

The micro-electromechanical system (MEMS) is a micromechanical structure formed by etching a silicon wafer, and can be used as a MEMS actuator which converts electrical signals to mechanical motion for controlling tiny movement.

In the image acquiring device having an auto-focus (AF) function or optical image stabilization (OIS) function, the MEMS actuator can be used to implement the exact adjustment of the focus length and sampling position.

SUMMARY

The present disclosure provides an encapsulation having a movable sensor and a manufacturing method thereof that have a sensor chip arranged on the elastic structure which has functions of restoring position and transmitting electrical signals.

The present disclosure provides a MEMS package including a fixed frame, a moveable platform and multiple elastic restoring members. The moveable platform is configured to be moved with respect to the fixed frame along at least one direction and having a rectangular shape, wherein the moveable platform comprises a plurality of comb electrodes at two opposite edges of the rectangular shape of the moveable platform. The multiple elastic restoring members are formed between the fixed frame and another two opposite edges, different from the two opposite edges, of the rectangular shape of the moveable platform, and configured to restore a position of the moved moveable platform.

The present disclosure further provides a MEMS package including a fixed frame, a moveable platform and four elastic restoring members. The fixed frame has a rectangular inner edge. The moveable platform is configured to be moved with respect to the fixed frame along two directions. The four elastic restoring members are straightly connected between the fixed frame and the moveable platform, and configured to restore a position of the moved moveable platform, wherein one end of each of the four elastic restoring members is arranged at one of four corners of the rectangular inner edge of the fixed frame.

The present disclosure further provides a MEMS package including a fixed frame, a moveable platform and at least one elastic restoring member. The moveable platform is configured to be moved with respect to the fixed frame along at least one direction. Each elastic restoring member is formed as a straight line between the fixed frame and the moveable platform, and configured to restore a position of the moved moveable platform.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1:
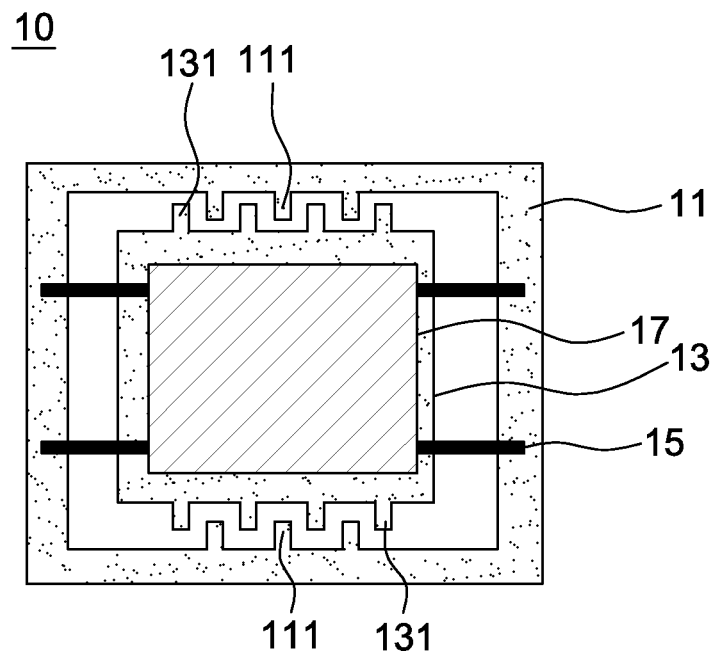
FIG. 1 is a top view of a sensor package according to one embodiment of the present disclosure.

Referring to FIG. 1, it is a top view of a sensor package 10 according to one embodiment of the present disclosure. The sensor package 10 is, for example, an image sensor package. The sensor package 10 includes a micro-electromechanical system (MEMS) actuator used to change the one-dimensional or two-dimensional position of a carried optoelectronic component. The optoelectronic component is a component independent from the MEMS actuator, and is arranged on the MEMS actuator via elastic restoring members after the MEMS actuator is manufactured. The optoelectronic component transmits detected data via the elastic restoring members.

The MEMS actuator includes a fixed frame 11 and a moveable platform 13 that are micro-electromechanical structures formed by processing a silicon wafer (illustrated by an example below) using the photolithography or etching process. In the processed silicon wafer, the moveable platform 13 is separated from the fixed frame 11 (only connected by elastic restoring members as mentioned below) such that the moveable platform 13 can move with respect to the fixed frame 11.

The fixed frame 11 has a plurality of first comb electrodes 111 (only a few being shown), and the moveable platform 13 has a plurality of second comb electrodes 131 (only a few being shown). As shown in FIG. 1, the first comb electrodes 111 are arranged at two opposite inner sides of the fixed frame 11, and the second comb electrodes 131 are arranged at two opposite edges of the moveable platform 13. The first comb electrodes 111 and the second comb electrodes 131 are used to generate electrostatic force to cause the moveable platform 13 to have movement along at least one direction with respect to the fixed frame 11. As shown in FIG. 1, each of the first comb electrodes 111 is arranged between two second comb electrodes 131, and each of the second comb electrodes 131 (in addition to the most outside second comb electrodes) is arranged between two first comb electrodes 111. By applying voltages on the first comb electrodes 111 and the second comb electrodes 131, attractive force or repulsive force is generated (depending on the voltage polarity being applied) to move the moveable platform 13.

The elastic restoring members 15 are formed by a patterned conductive metal layer such as Aluminum, Nickel, Gold or a combination thereof. The elastic restoring members 15 are the structure additionally formed on a silicon wafer (e.g., using deposition technology), but not formed by etching the silicon wafer. The elastic restoring members 15 are connected between the fixed frame 11 and the moveable platform 13, and used to restore the moved moveable platform 13 to an original position.

For example in FIG. 1, the moveable platform 13 is shown to have a rectangular shape, and the elastic restoring members 15 are formed between two opposite edges (shown as left and right edges) of the rectangular shape and the fixed frame 11. For example, one end of the elastic restoring members 15 is arranged on a surface of the fixed frame 11, and the other end thereof is arranged on a surface of the moveable platform 13. When the first comb electrodes 111 and the second comb electrodes 131 form electrostatic force along an up-down direction, the moveable platform 13 is moved along the up direction or down direction. The elastic restoring members 15 generate restoring force opposite to the electrostatic force.

The sensor chip 17 is, for example, a CMOS image sensor chip or CCD image sensor chip, and is disposed on the moveable platform 13. The sensor chip 17 transmits detected data, e.g., image data or data detected by other optoelectronic components, via the elastic restoring members 15. For the electrical connection, the sensor chip 17 includes solder balls or contact pads, e.g., multiple solder balls or contact pads under a bottom surface of the sensor chip 17 as electrical connection points. The sensor chip 17 is electrically connected to the elastic restoring members 15 via the solder balls or contact pads.

Figure 2:
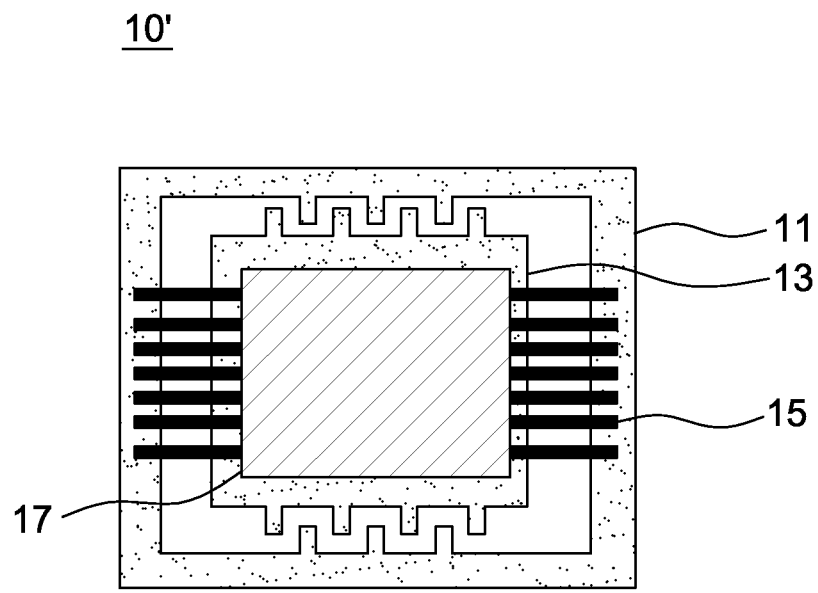
FIG. 2 is a top view of a sensor package according to another embodiment of the present disclosure.
Figure 3:
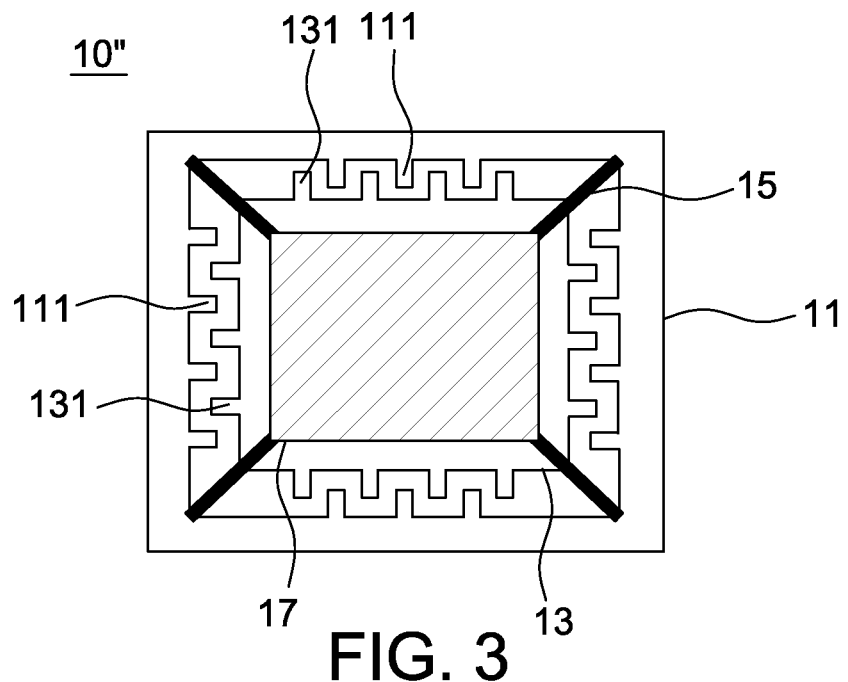
FIG. 3 is a top view of a sensor package according to an alternative embodiment of the present disclosure.

FIGS. 2 and 3 are top views of a sensor package according to other embodiments of the present disclosure. The sensor packages 10' and 10" also include a fixed frame 11, a moveable platform 13, elastic restoring members 15 and a sensor chip 17. The difference from FIG. 1 is that the fixed frame 11 and the moveable platform 13 in FIGS. 2 and 3 are connected by elastic restoring members 15 arranged in a different way to allow the moveable platform 13 to move in the one-dimensional direction or two-dimensional directions with respect to the fixed frame 11.

For example in FIG. 2, more elastic restoring members 15 are arranged at left and right edges of the rectangular moveable platform 13 to generate larger restoring force. It is appreciated that the amount of restoring force is determined not only according to a number of the elastic restoring members 15, but also according to a size and thickness of the elastic restoring members 15. The size, thickness and/or number of the elastic restoring members 15 are arranged during manufacturing according to the electrostatic force generated by the first comb electrodes 111 and the second comb electrodes 131. The amount of electrostatic force is determined, for example, according to a number, size, pitch and applied voltages of the first comb electrodes 111 and the second comb electrodes 131.

For example in FIG. 3, the elastic restoring members 15 are arranged between four corners of the moveable platform 13 and the fixed frame 11 to generate restoring force along two directions (e.g., up-down direction and left-right direction). Meanwhile, to generate electrostatic force in two directions, the first comb electrodes 111 and the second comb electrodes 131 are further arranged at two opposite sides along the left-right direction.

In the present disclosure, a number and position of the comb electrode sets 111 and 131 are not particularly limited but determined according to actual applications as long as the restoring force generated by the elastic restoring members 15 can balance the electrostatic force generated by the comb electrode sets 111 and 131.

It is appreciated that positions of the elastic restoring members 15 are arranged corresponding to electrical contacts (e.g., solder balls or contact pads) of the sensor chip 17 to allow the sensor chip 17 to be directly disposed on the moveable platform 13 and electrically combined to the elastic restoring members 15 via the electrical contacts. In addition, as the elastic restoring members 15 are further used to transmit detected data as well as the fixed frame 11 and the moveable platform 13 are applied with voltages to generate electrostatic force, an electrical insulation layer 16 is further formed between the moveable platform 13 and the elastic restoring members 15 and between the fixed frame 11 and the elastic restoring members 15, as shown in FIG. 4, to prevent from degrading the signal quality.

Figure 4:
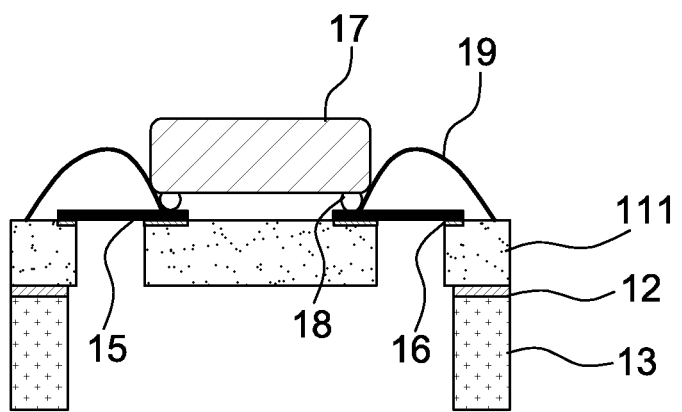
FIG. 4 is a side view of a sensor package according to an alternative embodiment of the present disclosure.

FIG. 4 is a side view of a sensor package according to another embodiment of the present disclosure, wherein the sensor chip 17 transmits electrical signals (e.g., control signals and/or detected data of the sensor chip 17) not only via the elastic restoring members 15 but also via at least one bonding wire 19 connected between the sensor chip 17 and the fixed frame 11. For example, the fixed frame 11 further has at least one electrical contact pad thereon, and at least one bonding wire is connected between the solder balls 18 and the at least one electrical contact pad on the fixed frame 11 using wire bonding technology. In FIG. 4, the fixed frame 11 includes a first silicon layer 111, a second silicon layer 13 and an oxide insulating layer 12 between the first silicon layer 111 and the second silicon layer 13.

Referring to FIGS. 5a-5f and 7, a manufacturing method of a sensor package according to a first embodiment of the present disclosure is illustrated below. The manufacturing method includes the steps of: providing a silicon on insulator (SOI) wafer having a first silicon layer, an oxide insulating layer and a second silicon layer (Step S71); forming a patterned metal layer on the first silicon layer (Step S72); etching the first silicon layer to form a platform region, a fixed frame and a groove between the platform region and the fixed frame (Step S73); etching the second silicon layer to form an exposed region corresponding to the platform region and the groove (Step S74); etching the oxide insulating layer within the exposed region to release the platform region to form a movable platform (Step S75); and arranging a sensor chip on the patterned metal layer (Step S76).

Figure 5A:
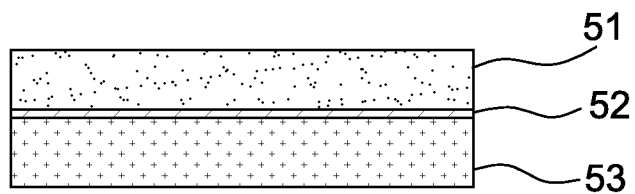
FIGS. 5a-5f are schematic diagrams of the manufacturing of a sensor package according to a first embodiment of the present disclosure.

Step S71: The SOI wafer has a first silicon layer 51, a second silicon layer 53 and an oxide insulating layer 52 sandwiched therebetween, as shown in FIG. 5a. The SOI wafer is selected from commercial available SOI wafers or a self-manufactured SOI wafer without particular limitations. For example, the first silicon layer 51 is a silicon wafer used as a device layer and having a thickness of about 10-20 micrometers, and the second silicon layer 53 is a silicon wafer used as a handle layer and having a thickness of about 300-400 micrometers. The oxide insulating layer 52 is used as an etch stop layer.

Figure 5B:
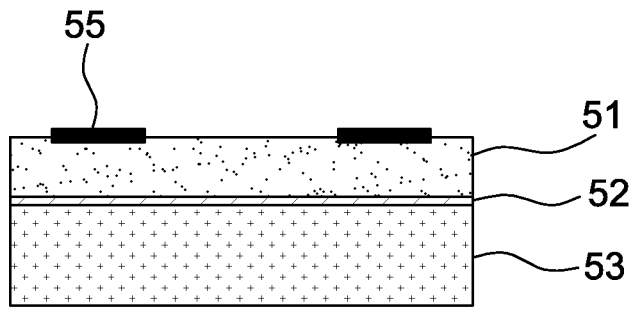

Step S72: Next, a patterned metal layer 55 having a predetermined pattern is formed on the first silicon layer 51, as shown in FIG. 5*b*, used as elastic restoring members for the MEMS actuator. The predetermined pattern is previously arranged according to positions of the solder balls 58 or contact pads of the sensor chip 57 to be disposed later (e.g., referring to FIG. 5*f*). The patterned metal layer 55 is formed, for example, by photolithography.

In addition, to improve signal quality, before the metal layer is deposited, an electrical insulation layer 16 (as shown in FIG. 4) is formed on the first silicon layer 51 firstly to electrically insulate the patterned metal layer 55 from the first silicon layer 51.

Figure 5C:
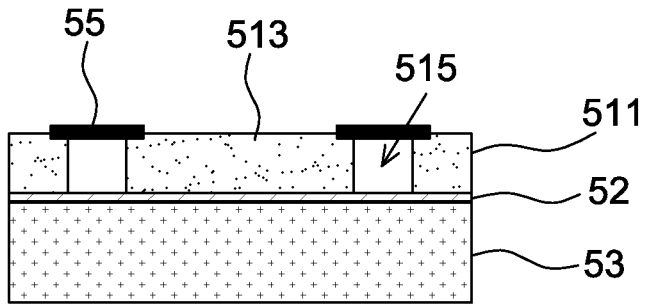

Step S73: Next, the first silicon layer 51 is etched by the vapor-phase etching or wet etching to form a platform region 513, a fixed frame 411 and a groove 515 between the platform region 513 and the fixed frame 511 as shown in FIG. 5*c*. The arrangement after the etching is selected from one of FIGS. 1-3 according to actual applications. With the existence of the oxide insulating layer 52, the etching 51 on the first silicon layer 51 stops while reaching the oxide insulating layer 52. After the etching of this step, the patterned metal layer 55 crosses the groove 515 and connects between the platform region 513 and the fixed frame 511 to be used as the elastic restoring member. The platform region 513 connects to the fixed frame 511 through the oxide insulating layer 511.

Figure 5D:
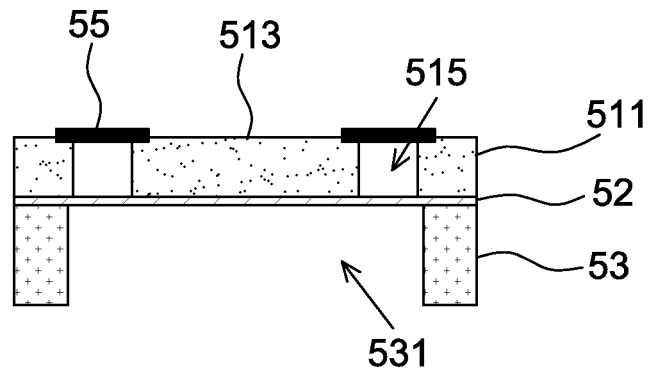

Step S74: To release the platform region 513 in the following steps, the second silicon layer 53 is etched (e.g., using dry/wet etching) to form an exposed region 531 corresponding to the platform region 513 and the groove 515 to expose a part of the oxide insulating layer 52. The etching also stops while reaching the oxide insulating layer 52, as shown in FIG. 5*d*.

It is appreciated that the protection layer is formed during the process of etching the first silicon layer 51 and the second silicon layer 53 in order to form a predetermined structure in the first silicon layer 51 and the second silicon layer 53. The first silicon layer 51 and the second silicon layer 53 are etched using the etching technology for manufacturing the MEMS, and thus details thereof are not described herein.

In addition, the Step S73 is not limited to be performed before the Step S74. It is possible to etch the second silicon layer 53 at first, and then the first silicon layer 51 is etched as long as the exposed oxide insulating layer 52 corresponds to the platform region 513 and the groove 515.

Figure 5E:
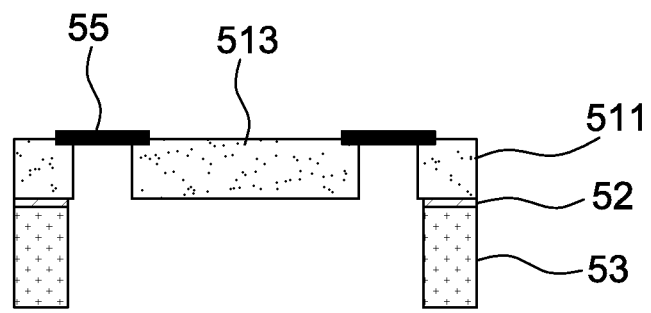

Step S75: Next, the oxide insulating layer 52 within the exposed region 531 is etched to release the platform region 513 to form a moveable platform, as shown in FIG. 5*e*. Due to different etching selection ratio, the etching performed on the oxide insulating layer 52 does not etch the first silicon layer 51 and the second silicon layer 53, or vice versa. After this step is finished, the platform region 513 connects to the fixed frame 511 only via the patterned metal layer 55, and the other part of the platform region 513 is totally separated from the fixed frame 511.

Figure 5F:
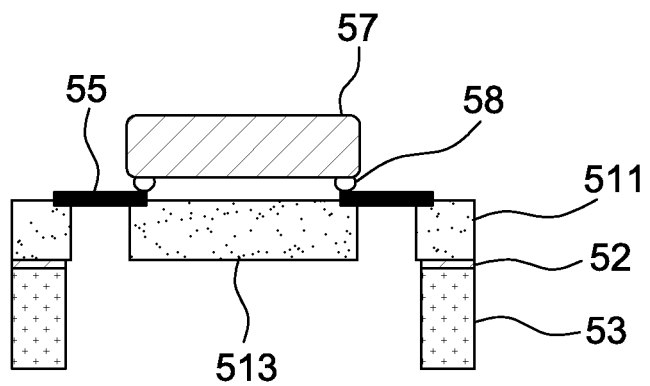

Step S76: Finally, a predetermined sensor chip 57 is disposed on the patterned metal layer 55. The sensor chip 57, for example, has solder balls 58 previously arranged on a bottom surface thereof. After the solder balls 58 are combined to the patterned metal layer 55 using a high temperature technology, the sensor package of the present disclosure is accomplished, as shown in FIG. 5*f*. The high temperature being used is determined according to the material of solder balls 58 and the temperature tolerance of the sensor chip 57.

In addition, if bonding wires are required to be arranged in addition to the patterned metal layer 55, the wire bonding is performed after the Step S76 or before the moveable platform 513 is released in the Step S75 to form at least one bonding wire between the sensor chip 57 and the fixed frame 511, as shown in FIG. 4. For example, at least one electrical contact pad is further formed on the fixed frame 511 and the platform region 513 to bond with the bonding wire. Accordingly, a part of solder balls 58 of the sensor chip 57 are arranged on the patterned metal layer 55, and the other part of solder balls 58 are arranged on the electrical contact pad of the platform region 513 to electrically connect with the bonding wire.

In the sensor package manufactured by FIGS. 5*a*-5*f*, the fixed frame 11 includes a first silicon layer 511, a second silicon layer 53 and an oxide insulating layer 52 between the first silicon layer 511 and the second silicon layer 53.

Referring to FIGS. 6*a*-6*h* and 8, a manufacturing method of a sensor package according to a second embodiment of the present disclosure is illustrated below. The manufacturing method includes the steps of: providing a first silicon layer having a first surface and a second surface (Step S81); forming a patterned metal layer on the first surface of the first silicon layer (Step S82); bonding a second silicon layer to the first surface of the first silicon layer (Step S83); thinning the first silicon layer (Step S84); etching the thinned first silicon layer to form a movable platform and a fixed frame (Step S85); bonding a third silicon layer to the thinned surface of the first silicon layer (Step S86); removing the second silicon layer to expose the moveable platform and the patterned metal layer (Step S87); and arranging a sensor chip on the patterned metal layer (Step S88).

Step S81: Instead of using an SOI wafer, a first silicon layer 61 is directly used to start the manufacturing. The first silicon layer 61 has a first surface 61S1 and a second surface 61S2 opposite to each other.

Figure 6A:
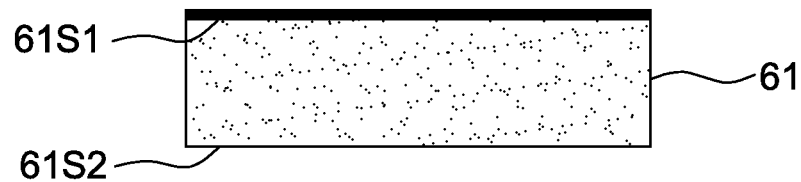
FIGS. 6a-6h are schematic diagrams of the manufacturing of a sensor package according to a second embodiment of the present disclosure.
Figure 6B:
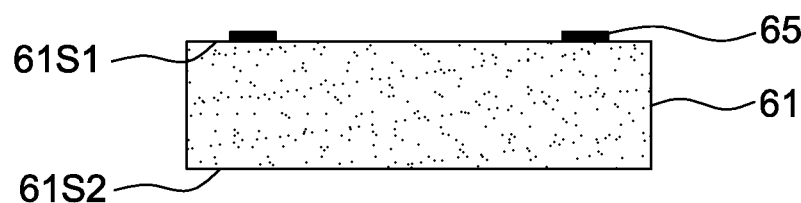

Step S82: A metal layer is deposited on the first surface 61S1 of the first silicon layer 61, as shown in FIG. 6*a*. The metal layer is formed by conductive metal such as Aluminum, Nickle, Gold or a combination thereof. Then, the patterned metal layer 65 is formed using photolithography, as shown in FIG. 6*b*. As mentioned above, a pattern of the patterned metal layer 65 is determined previously according to the arrangement of the solder balls or contact pads of the sensor chip being used.

In addition, to allow the patterned metal layer 65 to have good insulation from the first silicon layer 61, an electrical insulation layer 16, as shown in FIG. 4, is firstly formed on the first surface 61S1 of the first silicon layer 61 before the patterned metal layer 65 is formed to electrically isolate the first silicon layer 61 and the patterned metal layer 65.

Figure 6C:
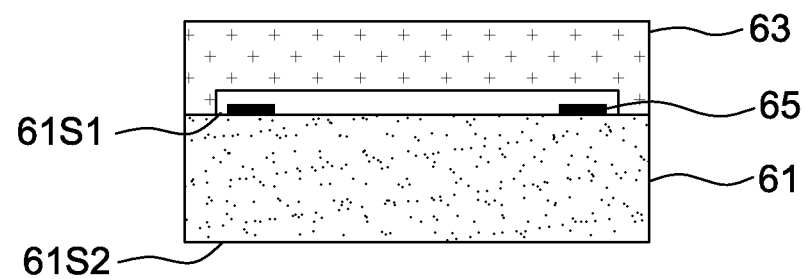

Step S83: Next, a second silicon layer 63 having an accommodation space is used to bond with the first surface 61S1 (with the part whose metal layer and electrical insulation layer 16, if there is, being removed) of the first silicon layer 61, and the patterned metal layer 65 is accommodated in the accommodation space. For example, FIG. 6*c* shows that the second silicon layer 63 is bonded to the first surface 61S1 of the first silicon layer 61 only with the fringe region thereof, but not limited thereto. The bonded region is determined according to a position of the moveable platform being arranged. For example, the second silicon layer 63 has walls extending upward from edges thereof such that the central area is lower than the fringe area. The first silicon layer 61 and the second silicon layer 63 are bonded using conventional wafer bonding technology without particular limitations.

Figure 6D:
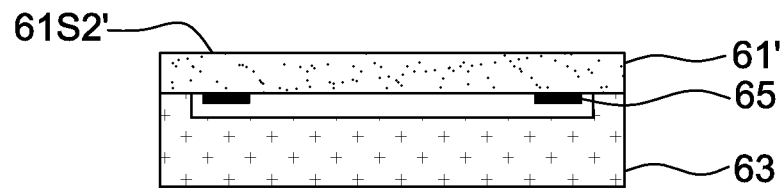

Step S84: Next, the first silicon layer 61 is thinned to form a thinned first silicon layer 61' having a thickness of about 10-20 micrometers, as shown in FIG. 6d. The thinning is performed by grinding or etching the second surface 61S2. In some embodiments, if the first silicon layer 61 is thin enough, the thinning step is omitted.

Figure 6E:
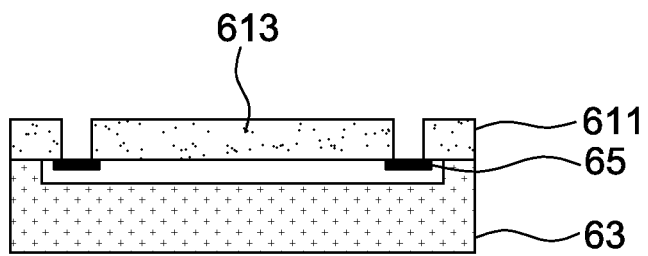

Step S85: Next, the thinned first silicon layer 61' is etched to form a moveable platform 613 and a fixed frame 611, as shown in FIG. 6e. The arrangement of the moveable platform 613 and the fixed frame 611 by etching the first silicon layer 61 is selected from one of FIGS. 1-3.

After this etching step is accomplished, the patterned metal layer 65 is connected between the moveable platform 613 and the fixed frame 611 to be used as elastic restoring members.

Figure 6F:
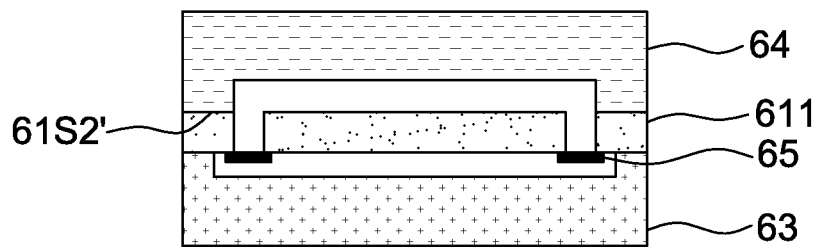

Step S86: Next, a third silicon layer 64 having an accommodation space is bonded to the thinned surface 61S2' of the first silicon layer 61, wherein the accommodation space is to allow the third silicon layer 64 not to contact with the moveable platform 613 to maintain the movement freedom of the moveable platform 613. Accordingly, as shown in FIG. 6f the third silicon layer 64 is bonded to the thinned surface 61S2' with the fringe region thereof (e.g., the region corresponding to the fixed frame 611). For example, the third silicon layer 64 has walls extending upward from edges thereof such that the central area is lower than the fringe area. The bonding between the thinned surface 61S2' of the first silicon layer 61 and the third silicon layer 64 is performed using conventional wafer bonding technology.

Figure 6G:
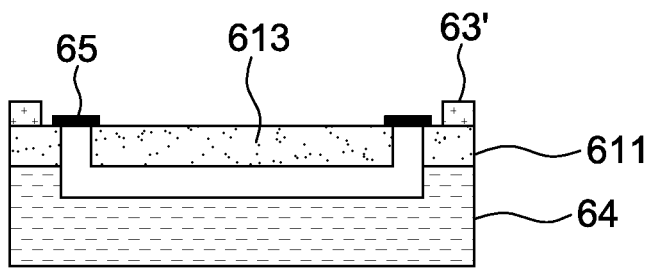
Figure 6H:
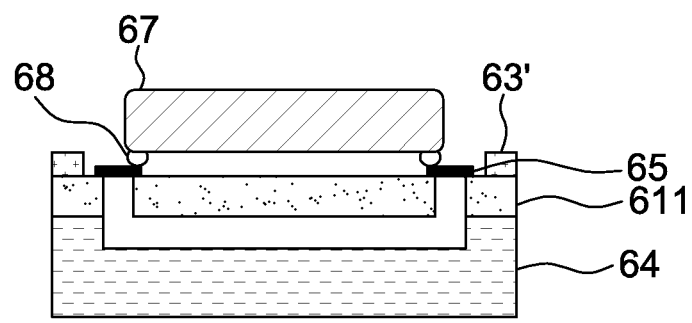

Step S87: Next, the second silicon layer 63 is removed to expose the moveable platform 613 and the patterned metal layer 65, as shown in FIG. 6g. For example, the second silicon layer 63 is removed by grinding or etching process to completely remove the second silicon layer 63 or leave a part of second silicon layer 63' behind which is bonded with the fixed frame 611 according to the MEMS structure and etching process.

Step S88: Finally, the sensor chip 67 to be carried is arranged on the patterned metal layer 65 to accomplish the sensor package of the present disclosure. The sensor chip 67, for example, has solder balls 68 or contact pads in the bottom surface thereof, and the solder balls 68 are combined to the patterned metal surface 65 using high temperature process to have good electrical connection.

In addition, if other signal transmission path in addition to the patterned metal layer 65 is required, at least one bonding wire 19, as shown in FIG. 4, is formed between the sensor chip 67 and the fixed frame 611 using wire bonding technology. Similarly, before forming the bonding wire 19, contact pads are firstly formed on the moveable platform 613 and the fixed frame 61 to electrically combine with the bonding wire 19.

In the sensor package manufactured by FIGS. 6a-6h, the fixed frame 11 includes silicon layers bonded to each other (e.g., first silicon layer 61, second silicon layer 63 and third silicon layer 64) but has no oxide insulating layer therebetween. The second silicon layer 63 and the third silicon layer 64 are respectively disposed at two different sides of the first silicon layer 61.

The MEMS actuator of the present disclosure is electrically connected to a circuit board (not shown) by solder so as to electrically connect to other components of the system (e.g., a portable electronic device) for transmitting signals via traces on the circuit board.

It should be mentioned that although the above embodiments are described with one- or two-dimensional linear movement as an example, the present disclosure is not limited thereto. In other embodiments, the MEMS actuator triggers the movement or rotation in multiple dimensions by other arrangements of the elastic restoring members.

It should be mentioned that although the above embodiments are described with the fixed frame 11 surrounding the moveable platform 13 continuously, the present disclosure is not limited thereto. In other embodiments, the fixed frame 11 is formed corresponding to only two or three edges of the moveable platform 13, or formed in a discontinuous way surrounding the moveable platform 13 without particular limitations as long as the moveable platform 13 is moveable with respect to the fixed frame 11.

It should be mentioned that although the above embodiments are described with a single sensor package, the present disclosure is not limited thereto. In the mass production, a plurality of sensor packages of the present disclosure are manufactured on a wafer simultaneously, and a plurality of single sensor packages is divided by wafer dicing. The dicing technology is known to the art and thus details thereof are not described herein.

It should be mentioned that although the above embodiments are described with the moveable platform being located in a middle position of the MEMS actuator, the present disclosure is not limited thereto. In other embodiments, the moveable platform is located at a position instead of the central position. In addition, it is possible to arrange more than one optoelectronic devices on the moveable platform according to different applications.

Figure 9:
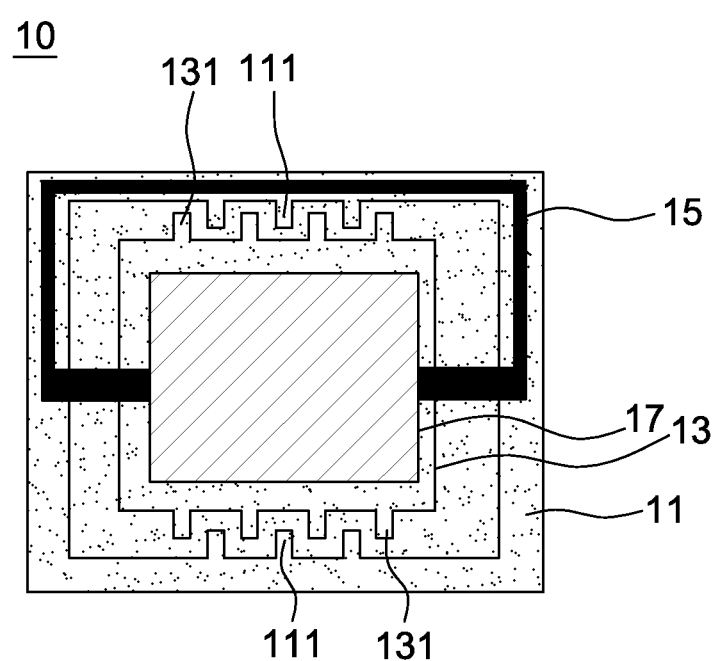
FIG. 9 is a top view of a sensor package according to an alternative embodiment of the present disclosure.

Although the above embodiments show that the sensor package 10 includes multiple elastic restoring members 15, but the present disclosure is not limited thereto. In a non-limiting embodiment, the sensor package 10 includes one elastic restoring members 15, e.g., as shown in FIG. 9. That is, in the present disclosure, the sensor package 10 includes at least one elastic restoring member 15 for providing a restoring force and a path for transmitting electrical signals.

Figure 7:
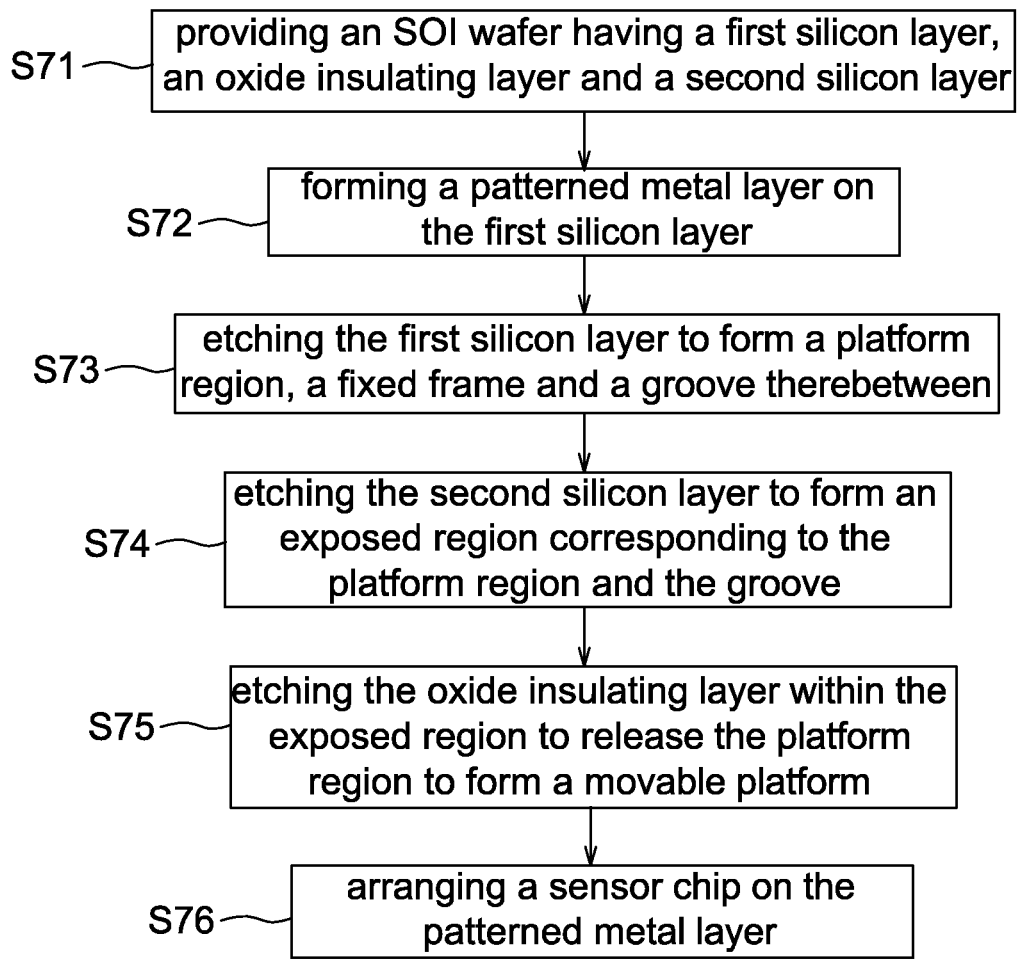
FIG. 7 is a flow chart of a manufacturing method of a sensor package according to a first embodiment of the present disclosure.
Figure 8:
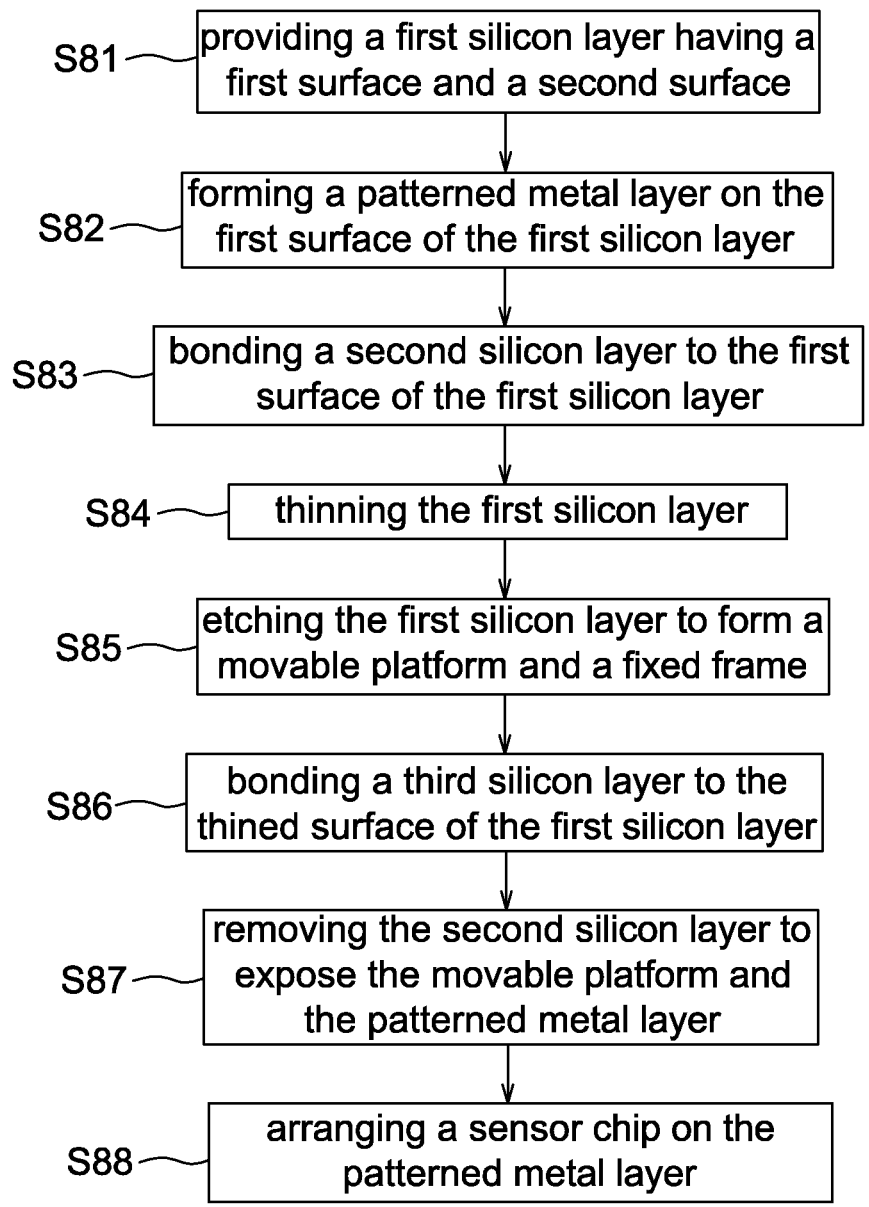
FIG. 8 is a flow chart of a manufacturing method of a sensor package according to a second embodiment of the present disclosure.

As mentioned above, the conventional MEMS can be used as an actuator to adjust the exact position. Therefore, the present disclosure provides a sensor package having a movable sensor (as shown in FIGS. 1 to 4) and a manufacturing method thereof (as shown in FIGS. 7-8) that dispose a sensor chip on the elastic restoring member to allow the elastic restoring member to have functions of transmitting signals and providing restoring force at the same time.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:
1. A micro-electromechanical system (MEMS) package, comprising:
 a fixed frame; and
 a moveable platform, configured to be moved with respect to the fixed frame along at least one direction and having a rectangular shape, wherein the moveable platform comprises a plurality of comb electrodes at two opposite edges of the rectangular shape of the moveable platform; and multiple elastic restoring members, formed between the fixed frame and another two opposite edges, different from the two opposite edges, of the rectangular shape of the moveable platform, and configured to restore a position of the moved moveable platform.

2. The MEMS package as claimed in claim 1, wherein the multiple elastic restoring members are formed by a patterned metal layer.

3. The MEMS package as claimed in claim 1, wherein the multiple elastic restoring members are formed as straight lines between the fixed frame and the moveable platform.

4. The MEMS package as claimed in claim 1, wherein the multiple elastic restoring members arranged at each of the another two opposite edges are all parallel to each other.

5. The MEMS package as claimed in claim 1, wherein the fixed frame comprises a plurality of comb electrodes opposite to the plurality of comb electrodes of the moveable platform configured to generate electrostatic force to move the moveable platform.

6. The MEMS package as claimed in claim 1, further comprising an electrical insulation layer formed
between the moveable platform and the multiple elastic restoring members, and
between the fixed frame and the multiple elastic restoring members.

7. The MEMS package as claimed in claim 1, further comprising a residual silicon layer on the fixed frame and outside the multiple elastic restoring members.

8. A micro-electromechanical system (MEMS) package, comprising:
a fixed frame, having a rectangular inner edge; and
a moveable platform, configured to be moved with respect to the fixed frame along two directions; and
four elastic restoring members, straightly connected between the fixed frame and the moveable platform, and configured to restore a position of the moved moveable platform, wherein one end of each of the four elastic restoring members is arranged at one of four corners of the rectangular inner edge of the fixed frame.

9. The MEMS package as claimed in claim 8, wherein the four elastic restoring members are formed by a patterned metal layer.

10. The MEMS package as claimed in claim 8, wherein the fixed frame comprises silicon layers bonded to each other without an oxide insulating layer therebetween.

11. The MEMS package as claimed in claim 8, wherein the fixed frame has a plurality of first comb electrodes and the moveable platform has a plurality of second comb electrodes, and
the plurality of first comb electrodes and the plurality of second comb electrodes are configured to generate electrostatic force to move the moveable platform.

12. The MEMS package as claimed in claim 8, further comprising an electrical insulation layer formed
between the moveable platform and the four elastic restoring members, and
between the fixed frame and the four elastic restoring members.

13. The MEMS package as claimed in claim 8, further comprising a residual silicon layer on the fixed frame and outside the four elastic restoring members.

14. A micro-electromechanical system (MEMS) package, comprising:
a fixed frame; and
a moveable platform, configured to be moved with respect to the fixed frame along at least one direction; and
at least one elastic restoring member, each being formed as a straight line between the fixed frame and the moveable platform, and configured to restore a position of the moved moveable platform.

15. The MEMS package as claimed in claim 14, wherein the at least one elastic restoring member is a patterned metal layer.

16. The MEMS package as claimed in claim 14, wherein the movable platform has a rectangular shape, and the at least one elastic restoring member is formed between two opposite sides of the rectangular shape and the fixed frame.

17. The MEMS package as claimed in claim 14, wherein the movable platform has a rectangular shape, and the at least one elastic restoring member is formed between four corners of the rectangular shape and the fixed frame.

18. The MEMS package as claimed in claim 14, wherein
the fixed frame has a plurality of first comb electrodes and the moveable platform has a plurality of second comb electrodes, and
the plurality of first comb electrodes and the plurality of second comb electrodes are configured to generate electrostatic force to move the moveable platform.

19. The MEMS package as claimed in claim 14, further comprising an electrical insulation layer formed
between the moveable platform and the at least one elastic restoring member, and
between the fixed frame and the at least one elastic restoring member.

20. The MEMS package as claimed in claim 14, further comprising a residual silicon layer on the fixed frame and outside the elastic restoring member.

* * * * *